United States Patent
Yoon et al.

(10) Patent No.: US 8,926,789 B2
(45) Date of Patent: *Jan. 6, 2015

(54) APPARATUS FOR THE REMOVAL OF A FLUORINATED POLYMER FROM A SUBSTRATE

(75) Inventors: Hyungsuk Alexander Yoon, San Jose, CA (US); John Boyd, Hillsboro, CA (US); Andras Kuthi, Thousand Oaks, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 492 days.

This patent is subject to a terminal disclaimer.

(21) Appl. No.: 12/750,612

(22) Filed: Mar. 30, 2010

(65) Prior Publication Data

US 2010/0181025 A1 Jul. 22, 2010

Related U.S. Application Data

(62) Division of application No. 11/237,477, filed on Sep. 27, 2005, now Pat. No. 7,691,278.

(51) Int. Cl.
| | |
|---|---|
| *C23F 1/00* | (2006.01) |
| *H01L 21/306* | (2006.01) |
| *C23C 16/00* | (2006.01) |
| *H01L 21/02* | (2006.01) |
| *B08B 7/00* | (2006.01) |

(52) U.S. Cl.
CPC ........ *H01L 21/02087* (2013.01); *B08B 7/0035* (2013.01)
USPC ................. 156/345.31; 156/345.43; 118/719; 118/723 E (58) Field of Classification Search
CPC .............. H05H 2001/2412; H05H 2001/2418; H05H 2001/2425; H05H 2001/2431; H05H 2001/2437; H05H 2001/2443; H05H 2001/245; H05H 2001/2446; H05H 2001/2462; H05H 2001/2468; H01J 37/32348; H01J 37/32899
USPC ...... 118/722, 723 R, 723 E, 719; 156/345.32, 156/345.43–345.47; 216/63, 67; 438/706, 438/707, 710

See application file for complete search history.

(56) References Cited

U.S. PATENT DOCUMENTS

| 3,779,882 A | 12/1973 | Rosenthal |
|---|---|---|
| 5,185,132 A | 2/1993 | Horiike et al. |

(Continued)

FOREIGN PATENT DOCUMENTS

| GB | 1362200 A | 7/1974 |
|---|---|---|
| GB | 1373402 A | 11/1974 |

(Continued)

OTHER PUBLICATIONS

Okazaki et al., "Appearance of stable glow discharge in air, argon, oxygen and nitrogen at atmospheric pressure using a 50 Hz source", J Phys D, Appl Phys, 26, pp. 889-892, 1993.

(Continued)

*Primary Examiner* — Maureen Gramaglia
(74) *Attorney, Agent, or Firm* — Martine Penilla Group, LLP (57) ABSTRACT

An apparatus generating a plasma for removing fluorinated polymer from a substrate is provided. The apparatus includes a powered electrode assembly, which includes a powered electrode, a first dielectric layer, and a first wire mesh disposed between the powered electrode and the first dielectric layer. The apparatus also includes a grounded electrode assembly disposed opposite the powered electrode assembly so as to form a cavity wherein the plasma is generated. The first wire mesh is shielded from the plasma by the first dielectric layer when the plasma is present in the cavity, which has an outlet at one end for providing the plasma to remove the fluorinated polymer.

19 Claims, 10 Drawing Sheets

(56) References Cited

U.S. PATENT DOCUMENTS

| | | | |
|---|---|---|---|
| 5,369,336 | A | 11/1994 | Koinuma et al. |
| 5,693,241 | A | 12/1997 | Banks et al. |
| 5,904,154 | A | 5/1999 | Chien et al. |
| 5,961,772 | A | 10/1999 | Selwyn |
| 6,178,660 | B1 * | 1/2001 | Emmi et al. .................... 34/412 |
| 6,189,570 | B1 | 2/2001 | Redemann et al. |
| 6,424,091 | B1 | 7/2002 | Sawada et al. |
| 6,534,921 | B1 | 3/2003 | Seo et al. |
| 6,936,546 | B2 * | 8/2005 | Robbins ........................ 438/707 |
| 7,220,396 | B2 | 5/2007 | Aardahl et al. |
| 7,651,585 | B2 * | 1/2010 | Yoon et al. ............... 156/345.43 |
| 7,662,253 | B2 * | 2/2010 | Yoon et al. ............... 156/345.43 |
| 2003/0064169 | A1 * | 4/2003 | Hong et al. .................... 427/569 |
| 2005/0211685 | A1 | 9/2005 | Blankenship |
| 2005/0214476 | A1 | 9/2005 | Goodwin et al. |
| 2006/0071608 | A1 | 4/2006 | Malik et al. |
| 2007/0068899 | A1 | 3/2007 | Yoon |
| 2007/0072432 | A1 | 3/2007 | Yoon et al. |
| 2007/0072433 | A1 | 3/2007 | Yoon et al. |

FOREIGN PATENT DOCUMENTS

| | | | |
|---|---|---|---|
| JP | 6-119995 | 4/1994 | |
| JP | 2001-007095 | 1/2001 | |
| JP | 2002-217179 | 8/2002 | |
| WO | WO-00/05749 A2 | 2/2000 | |
| WO | WO 2005045873 A * | 5/2005 | ............. H01J 37/00 |

OTHER PUBLICATIONS

Kogoma et al., "Raising of Ozone Formation Efficiency in a Homogeneous Glow Discharge Plasma at Atmospheric Pressure", J Phys D, Appl Phys, 27, pp. 1985-1987, 1994.

Aldea et al., "Generation of a Stable Atmospheric Glow in a DBD Configuration", Undated, Eindhoven Univ of Tech, Netherlands, 6 pp.

Babayan et al., "Deposition of silicon dioxide films with a non-equilibrium atmospheric-pressure plasma jet", Sep. 12, 2001, Institute of Physics Publishing., pp. 573-578, stacks.iop.org/PSST/10/573.

Davis, Warren, Ph.D., "How does a Faraday Cage Work? Or, Why can a Satellite Dish have Holes in it?", (2005), http://www.physlink.com/Education/AskExperts/ae176.cfm, Newton, MA.

Fong, H.P., "Electroless Cu Deposition Process on TIN for ULSI interconnect fabrication via Pd/Sn colloid activation", Aug. 22, 2005, Journal of Electronic Materials, http://www.findarticles.com/p/articles/mi_qa3776/is_200301/ai_n9178017/print.

Ichiki et al., "An atmospheric-pressure microplasma jet source for the optical emission spectroscopic analysis of liquid sample", Sep. 18, 2003, (Inst. of Phys. Pub., Plasma Srcs Sci Tech. 12), pp. 16-20, stacks.iop.org/PSST/12/S16.

Kogelschatz, U., "Fundamentals and Applications of Dielectric-Barrier Discharges", May 24, 2000, ABB Corp Research Ltd, Baden, Switzerland, 7 pp.

Selwyn et al., "Materiais Processing using an Atmospheric-Pressure Plasma Jet", (1999-2000) Physics Division Progress Report., pp. 189-197.

Tepper, et al., "Pulsed uniform barrier discharges at atmospheric pressure", (Aug./Sep. 1998), Hakone VI Int'l Symp. on High Pressure, Low Temp Plasma Chem., Cork, Ireland, 5 pp.

Kunze, Kerstin "Miniaturized Discharges Prospects and Limits for Quantitative Analysis", (Dissertation) Jun. 25, 2004, Dortmund, Germany, 133 pp.

"International Search Report", Date Mailed: Sep. 25, 2007, International Application No. PCT/US06/36139, Filed: Sep. 15, 2006.

"Written Opinion", Date Mailed: Sep. 25, 2007, International Application No. PCT/US06/36139, Filed: Sep. 15, 2006.

"International Preliminary Report on Patentability", Issued in PCT Application No. PCT/US2006/036139; Mailing Date.: Apr. 10, 2008.

"Search and Examination Report", Issued in Singapore Application No. 200802154-5; Mailing Date: Mar. 13, 2009.

"Non Final Office Action", U.S. Appl. No. 11/237,447, Mailing Date: Jun. 18, 2008.

"Final Office Action", U.S. Appl. No. 11/237,447, Mailing Date: Dec. 23, 2008.

"Non Final Office Action", U.S. Appl. No. 11/237,447, Mailing Date: Apr. 15, 2009.

"Notification of Reasons of Refusal", Japanese Patent Application No. 2008-533419, Mailing Date: Oct. 4, 2011.

* cited by examiner

APPARATUS FOR THE REMOVAL OF A FLUORINATED POLYMER FROM A SUBSTRATE

PRIORITY CLAIM

This divisional application claims priority under 37 CFR 1.53(b) of and claims the benefit under 35 U.S.C, §120 to a commonly assigned patent application entitled "Apparatus For The Removal Of A Fluorinated Polymer From A Substrate and Methods Therefor," by Ynon et al., application Ser. No. 11/237,477 filed on Sep. 27, 2005, which issued as U.S. Pat. No. 7,691,278, on Apr. 6, 2010, all of which are incorporated herein by reference.

BACKGROUND OF THE INVENTION

The present invention relates in general to substrate manufacturing technologies and in particular to apparatus for the removal of a fluorinated polymer from a substrate and methods therefor.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited. Control of the transistor gate critical dimension (CD) on the order of a few nanometers is a top priority, as each nanometer deviation from the target gate length may translate directly into the operational speed of these devices.

Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant gases are then flowed into the chamber and struck to form a plasma to etch exposed areas of the substrate.

During the etch process, it is not uncommon for polymer byproducts (e.g., fluorinated polymers, etc.) to form on the substrate. Fluorinated polymers generally comprise photoresist material previously exposed to an etch chemistry, or polymer byproducts deposited during a fluorocarbon etch process. In general, a fluorinated polymer is a substance with a chemical equation of $C_xH_yF_z$, where x, z are integers greater than 0, and y is an integer greater than or equal to 0 (e.g., $CF_4$, $C_2F_6$, $CH_2F_2$, $C_4F_8$, $C_5F_8$, etc.).

As successive polymer layers are deposited as the result of several different etch processes, organic bonds that are normally strong and adhesive will eventually weaken and peel or flake off, often onto another substrate during transport. For example, substrates are commonly moved in sets between plasma processing systems via substantially clean containers, often called cassettes. As a higher positioned substrate is repositioned in the container, a portion of a polymer layer may fall on a lower substrate where dies are present, potentially affecting device yield.

A common method of polymer removal is by wet chemicals. However, although effective in removing photoresist, wet cleaning processes are not as effective at removing of sidewall polymers. Another commonly used method is the use of $O_2$ plasma under vacuum conditions (below about 1 Torr pressure range). However, although effective at removal of both photoresist and sidewall polymers, $O_2$ plasma also generally requires expensive plasma processing equipment in order to maintain vacuum conditions, as well as being time consuming since a separate substrate processing station must normally be set up in order to remove the fluorinated polymers.

Yet another commonly known, relatively simple, and low-cost method of fluorinated polymer removal may be the use of an atmospheric (or high pressure) plasma jet (APPJ), which generally allows a plasma to be focused on a particular location on the substrate, thus minimizing potential damage to dies on the substrate. An APPJ device generally mixes a large amount of an inert gas (e.g., He, etc.) with a small amount of a reactive gas (e.g., $CF_4$, $H_2$, $O_2$, etc.) in an annular volume (e.g., tube, cylinder, etc.) formed between an rf-powered electrode (along a longitudinal axis of the source) and a grounded electrode. The generated plasma may then be forced out one end of the annular volume (plasma effluent) by pressure caused by the influx of gases (gas influent). The shape and size of the plasma effluent may be controlled by adjusting the gas influent pressure, as well as the shape and size of the discharge orifice on the APPJ device.

In addition, an APPJ may also be combined with a reactive ion etch (RIE) in order to remove the fluorinated polymer. In general, RIE combines both chemical and ion processes in order to remove material from the substrate. Generally ions in the plasma enhance a chemical process by striking the surface of the substrate, and breaking the chemical bonds of the atoms on the surface in order to make them more susceptible to reacting with the molecules of the chemical process. Operating at ambient pressure conditions, atmospheric plasmas tend to relatively inexpensive in comparison to low-pressure plasmas that require sophisticated pumping systems to operate at near vacuum conditions. However, APPJ devices also tend to be susceptible to arcing.

An arc is generally a high power density short circuit which has the effect of a miniature explosion. When arcs occur on or near the surfaces of the target material or chamber fixtures, substantial damage can occur, such as local melting. Plasma arcs are generally caused by low plasma impedance which results in a steadily increasing current flow. If the resistance is low enough, the current will increase indefinitely (limited only by the power supply and impedance), creating a short circuit in which all energy transfer takes place. This may result in damage to the substrate as well as the plasma chamber. In order to inhibit arcing, relatively high plasma impedance generally must be maintained. A common solution may be to limit the rate of ionization in the plasma by using a large volume of inert gas at a relatively high flow rate. Another solution may be to position slots along the longitudinal axis of the powered electrode with the same electrical potential, in order to reduce the likelihood of arcing.

For example, in a common atmospheric plasma configuration, rf power creates an electrical discharge between a power electrode and a set of grounded electrodes that causes a process gas such as $O_2$ to ionize. However, as the density of electrically charged species (i.e., ions, etc.) in the plasma increases (typically above 2%), the likelihood of destructive arcing at the exposed electrode also increases. Hence, most atmospheric plasma processes typically also comprise mostly non-electrically charged (inert) gas, such as He, which limit ionization. In a fluorinated polymer byproduct removal application, however, the large volume (high flow) of inert gas may make the use of atmospheric plasma economically impractical. For example, the substantial removal of a fluorinated polymer from just a 5 $mm^2$ surface area on the substrate may require over 10 slm (standard liters per minute) of an inert gas. This may correspond to the consumption of over 100 liters of the inert gas for a single typical 300 mm substrate. Aside from the cost of obtaining a large volume of a semi-conductor grade inert gas, the storage of such a volume in a substrate fabrication facility may be unworkable. Additionally, because of equipment cost, cleaning and recycling the inert gas may be economically impractical.

Figure 1:
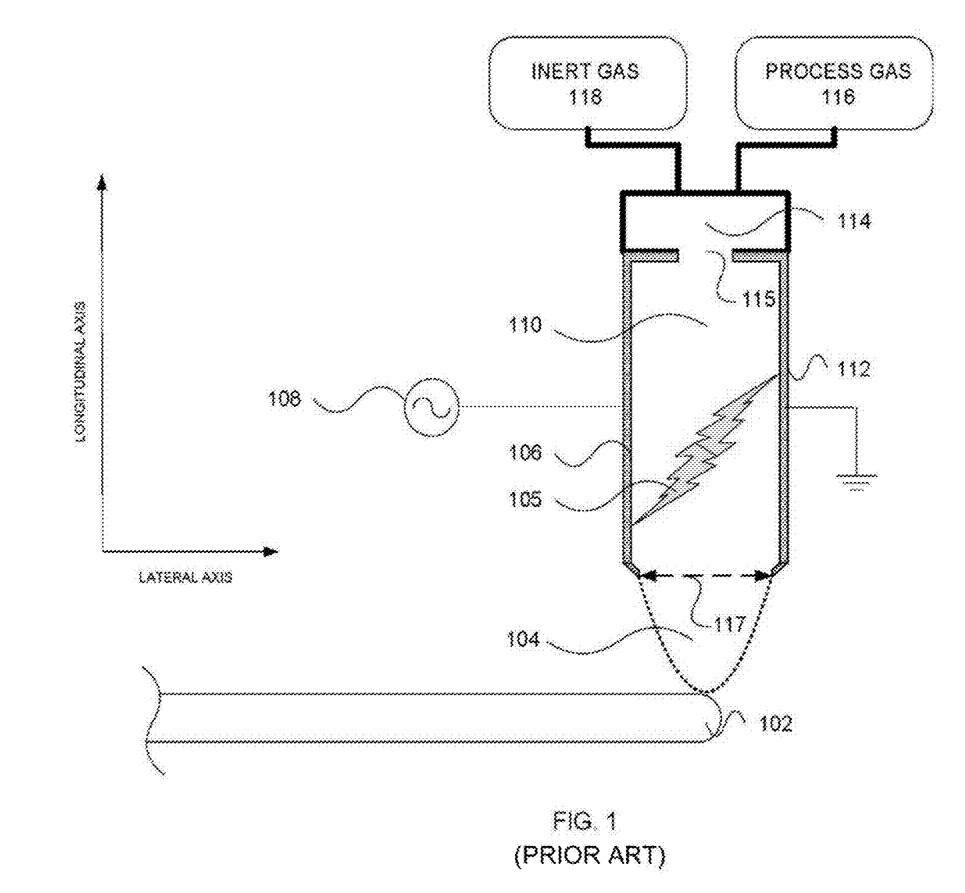
FIG. 1 shows a simplified diagram of an atmospheric plasma jet device, in which both the powered electrode and the ground electrode are each configured on a cavity wall.

Referring now to FIG. 1, a simplified diagram of an atmospheric plasma jet device, in which both the powered electrode and the ground electrode are each configured on a cavity wall, is shown. Generally, an inert gas 118 (e.g., He, etc.) and a process gas 116 (e.g., $CF_4$, $H_2$, $O_2$, etc.) are flowed into sealed box 114 for pressurizing. The gases are, in turn, feed into a discharge chamber cavity 110 through gas influent 115, at which point a plasma is struck with an RF power source 108 and creates plasma effluent 104 from discharge orifice 117 at one end of cavity 110 to clean substrate 102. In general, the shape and diameter of discharge orifice 117 may affect the corresponding shape of plasma effluent 104 along both the lateral and longitudinal axis (e.g., laterally narrow and longitudinally deep, laterally wide and longitudinally shallow, etc.). However, as previously stated, a large volume of inert gas may be required to prevent the generation of arc 105 between powered electrode 106 to grounded electrode 112.

Figure 2:
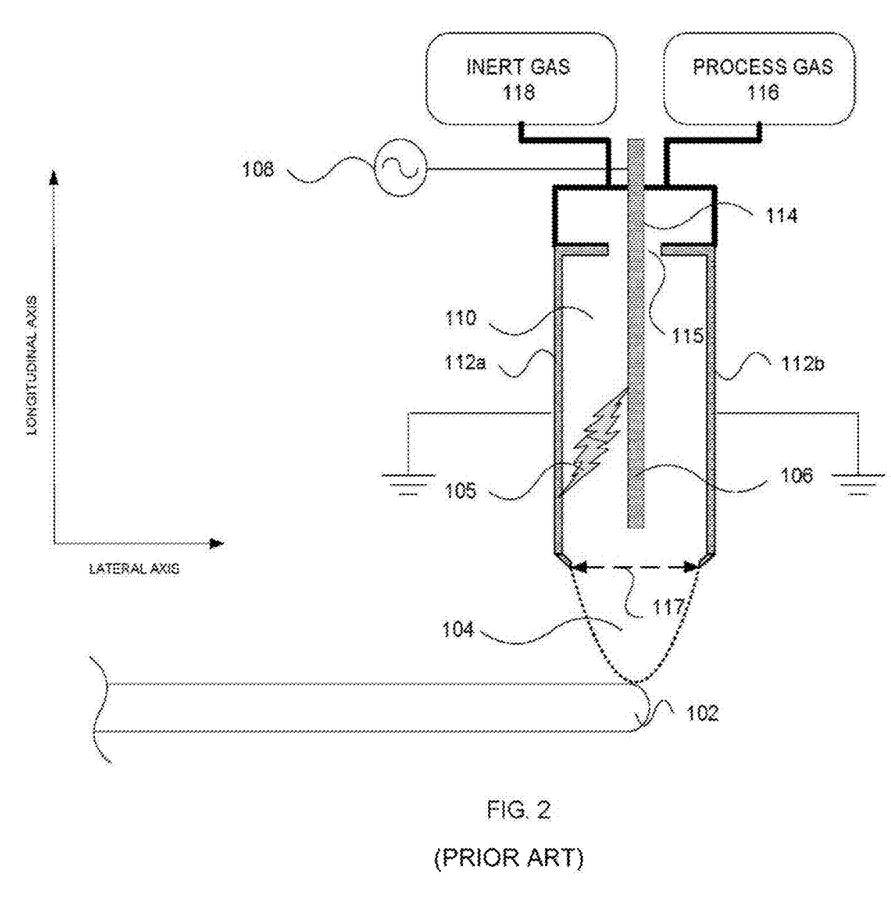
FIG. 2 shows a simplified diagram of an atmospheric plasma jet device, in which a powered electrode is configured as a center rod and a ground electrode(s) is configured on a cavity wall.

Referring now to FIG. 2, a simplified diagram of an atmospheric plasma jet device, in which a powered electrode is configured as a center rod and a grounded electrode(s) is configured on a cavity inner surface, is shown. As before, generally, an inert gas 118 (e.g., He, etc.) and a process gas 116 (e.g., $CF_4$, $H_2$, $O_2$, etc.) are flowed into sealed box 114 for pressurizing. The gases are, in turn, feed into a discharge chamber cavity 110 through gas influent 115, at which point a plasma is struck with an RF power source 108 and creates plasma effluent 104 from discharge orifice 117 at one end of cavity 110 to clean substrate 102. In general, the shape and diameter of discharge orifice 117 may affect the corresponding shape of plasma effluent 104 along both the lateral and longitudinal axis (e.g., laterally narrow and longitudinally deep, laterally wide and longitudinally shallow, etc.). However, as previously stated, a large volume of inert gas may be required to prevent the generation of arc 105 between powered electrode 106 to grounded electrode 112.

In view of the foregoing, there are desired apparatus for the removal of a fluorinated polymer from a substrate and methods therefor.

SUMMARY OF THE INVENTION

The invention relates, in an embodiment, to an apparatus generating a plasma for removing fluorinated polymer from a substrate. The embodiment includes a powered electrode assembly, including a powered electrode, a first dielectric layer, and a first wire mesh disposed between the powered electrode and the first dielectric layer. The embodiment also includes a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the fluorinated polymer.

The invention relates, in an embodiment, to a method for generating a plasma for removing fluorinated polymer from a substrate. The method includes providing a powered electrode assembly, the powered electrode assembly including a powered electrode, a first dielectric layer, and a first wire mesh disposed between the powered electrode and the first dielectric layer. The method also includes providing a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the fluorinated polymer. The method further includes introducing at least one inert gas and at least one process gas into the cavity, and applying an rf field to the cavity using the powered electrode to generate the plasma from the at least one inert gas and the at least one process gas.

The invention relates, in an embodiment, to a method for generating a plasma for removing fluorinated polymer from a substrate. The method includes providing a powered electrode assembly, the powered electrode assembly including a powered electrode, a first dielectric layer, and a first wire mesh disposed between the powered electrode and the first dielectric layer. The method further includes providing a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the fluorinated polymer. The method also includes applying an rf field to the cavity using the powered electrode to generate the plasma from at least one inert gas and the at least one process gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, the inventor believes that an atmospheric pressure plasma jet device, in which a dielectric barrier and a wire mesh are positioned between at least one electrode and a plasma (DWM-APPJ), may minimize arcing at a relatively low (less than 1 slm) inert gas flow rate, and hence may effectively remove a fluorinated polymer from a substrate.

In general, arcing occurs when an over voltage is applied to the discharge gap between electrodes, such that electron avalanches reach a critical stage where extremely fast streamer propagation becomes possible. As a result, micro discharge channels are formed. However, since a dielectric barrier also tends to act as an electret (generally a material that accumulates electrical charges on its surface), the micro discharge channels spread across the dielectric barrier into surface discharges covering a much larger region than the original channel diameter. Due to charge build-up on the dielectric surface, the field at the location of a micro discharge collapses within a few nanoseconds after breakdown, thus terminating the current flow at this location. However, often this breakdown may also result in collapse of the plasma itself. In an advantageous way, the wire mesh prevents this collapse.

In general, electromagnetic waves, such as produced by an rf generator, do not penetrate through holes in a conducting surface like a wire mesh that are less than about a wavelength across. The generated rf field may be attenuated in different amounts and to different degrees by altering diameter of the wire mesh holes. It is believed that the creation of a secondary electric field on the surface of the dielectric barrier by the wire mesh with properly sized holes helps to sustain a plasma without arcing at a substantially smaller inert gas flow rate. Thus, the addition of at least one wire mesh between an electrode and a dielectric barrier in a DWM-APPJ allows a plasma jet to be generated that may substantially remove fluorinated polymer byproducts at a particular substrate location, at relatively small inert gas flow rates (less than 1 slm). In addition, unlike previous APPJ configurations, DWM-APPJ does not require slots along the longitudinal axis of the powered electrode. Slots generally increase the size, complexity, and cost of an APPJ.

Generally, the tolerance of one wavelength of the rf is taken to be the approximate cross over point between satisfactory and unsatisfactory performance. However, in general, holes or surface variations in the wire mesh must usually be less than a fraction of a wavelength across in order not to impose unacceptable performance degradation. In addition, the wire mesh is generally not grounded in order to allow penetration of the rf field into the plasma.

In an embodiment, a dielectric barrier is positioned between a single electrode and a plasma. In an embodiment, a dielectric barrier is positioned between all the electrodes and a plasma. In an embodiment, a dielectric barrier is positioned between a powered electrode and a plasma. In an embodiment, a dielectric barrier is positioned between a grounded electrode and a plasma. In an embodiment, a wire mesh is placed between the dielectric barrier and an electrode. In an embodiment, a wire mesh is placed between each dielectric barrier and electrode. In an embodiment, a wire mesh is placed between a dielectric barrier and a powered electrode. In an embodiment, a wire mesh is placed between a dielectric barrier and a grounded electrode. In embodiment, the process gas is $H_2$. In and embodiment, the process gas is $O_2$. In and embodiment, the process gas is $CF_4$.

In an embodiment, the wire mesh comprises Copper (Cu). In an embodiment, the wire mesh comprises stainless steel. In an embodiment, the wire mesh comprises brass. In an embodiment, the wire mesh is galvanized. In an embodiment, the wire mesh is monofilament. In an embodiment, the wire mesh has a rectangular, weave. In an embodiment, the wire mesh has a hexagon weave. In an embodiment, the dielectric comprises a polyethylene terephthalate polyester film, such as MYLAR®. In an embodiment, the dielectric comprises a ceramic. In an embodiment, the dielectric comprises a synthetic fluoropolymer of tetrafluoroethylene, such as TEFLON®.

Figure 3:
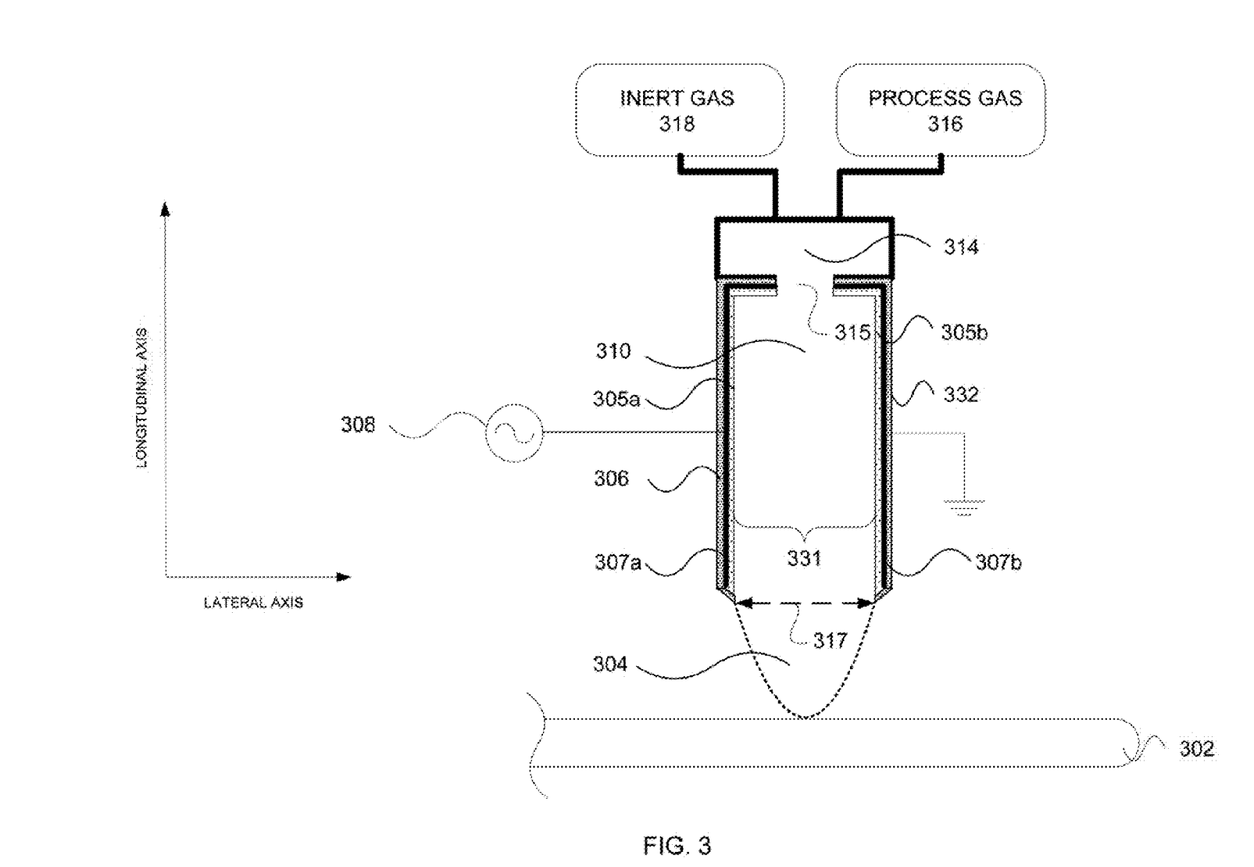
FIG. 3 shows a simplified diagram of a DWM-APPJ device, which both the powered electrode and the ground electrode are each configured on a cavity wall, according to an embodiment of the invention.

Referring now to FIG. 3, a simplified diagram of a DWM-APPJ device is shown, which both the powered electrode and the ground electrode are each configured on a cavity wall, according to an embodiment of the invention. In addition, unlike commonly used configurations, wire mesh 307a positioned between powered electrode 306 and dielectric barrier 305a, and wire mesh 307b positioned between grounded electrode 332 and dielectric barrier 305b, may allow a plasma to be sustained without arcing at a substantially smaller inert gas flow rate (less than 1 slm) than is commonly required (e.g., about 10 slm, etc.). Generally, an inert gas 318 and a process gas 316 are flowed into sealed box 314 for pressurizing. The gases are, in turn, feed into a discharge chamber cavity 310 through gas influent 315, at which point plasma is struck with an RF power source 308 and creates plasma effluent 304 from discharge orifice 317 at one end of cavity 310, in order to clean substrate 302. In addition, although each electrode is configured with a wire mesh in this embodiment, other embodiments may comprise only a single wire mesh on either powered electrode 306 or grounded electrode 332. In embodiment, diameter 331 is about between 0.5 mm and about 6 mm. Advantages of this embodiment include the ability to generate a plasma jet that substantially removes fluorinated polymer byproducts with a relatively small inert gas flow rate (less than about 1 slm), avoiding the cost of obtaining a large volume or a semi-conductor grade inert gas, or in purchasing expensive inert gas recycling equipment.

Figure 4:
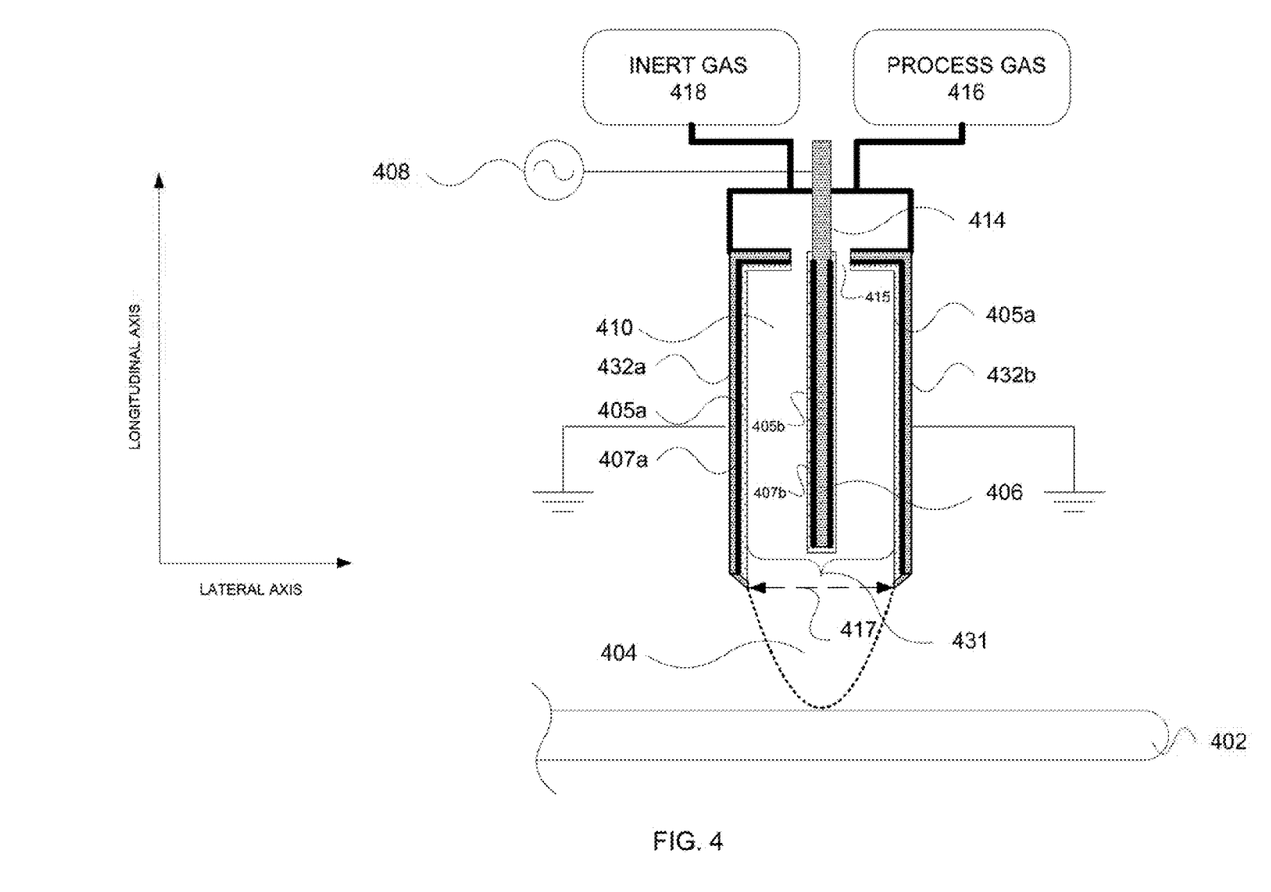
FIG. 4 shows a simplified diagram of a DWM-APPJ device in which a powered electrode is configured as a center rod and a ground electrode(s) is configured on a cavity inner surface, according to an embodiment of the invention.

Referring now to FIG. 4, a simplified diagram of a DWM-APPJ device is shown, in which a powered electrode is configured as a center rod and a ground electrode(s) is configured on a cavity inner surface, according to an embodiment of the invention. In addition, unlike the prior art, a wire mesh 407b positioned between powered electrode 406 and dielectric barrier 405b, and wire mesh 407a is positioned between grounded electrode 432a-b and dielectric barrier 405a, may allow a plasma to be sustained without arcing at a substantially smaller inert gas flow rate (less than about 1 slm) than is commonly required (e.g., about 10 slm, etc.). As before, generally, an inert gas 418 and a process gas 416 are flowed into sealed box 414 for pressurizing. The gases are, in turn, feed into a discharge chamber cavity 410 through gas influent 415, at which point a plasma is struck with an rf power source 408 and creates plasma effluent 404 from discharge orifice 417 at one end of cavity 410 to etch or clean substrate 402. In embodiment, diameter 431 is about between 0.5 mm and about 6 mm. Advantages of this embodiment include the ability to generate a plasma jet that substantially removes fluorinated polymer byproducts with a relatively small inert gas flow rate (less than about 1 slm), avoiding the cost of obtaining a large volume of a semi-conductor grade inert gas, or in purchasing expensive inert gas recycling equipment.

For example, using a DWM-APPJ device in order to fluorinated polymer, at a power setting of 1-20 W RF power, and a frequency of about 2 MHz to about 13.56 MHz, less than about 1 slm of He flow may be required to prevent arcing with about 100 sccm to about 500 sccm of $O_2$ flow. This is substantially less than about 10 slm of He normally required for a comparable operation with a commonly used APPJ device.

Figure 5:
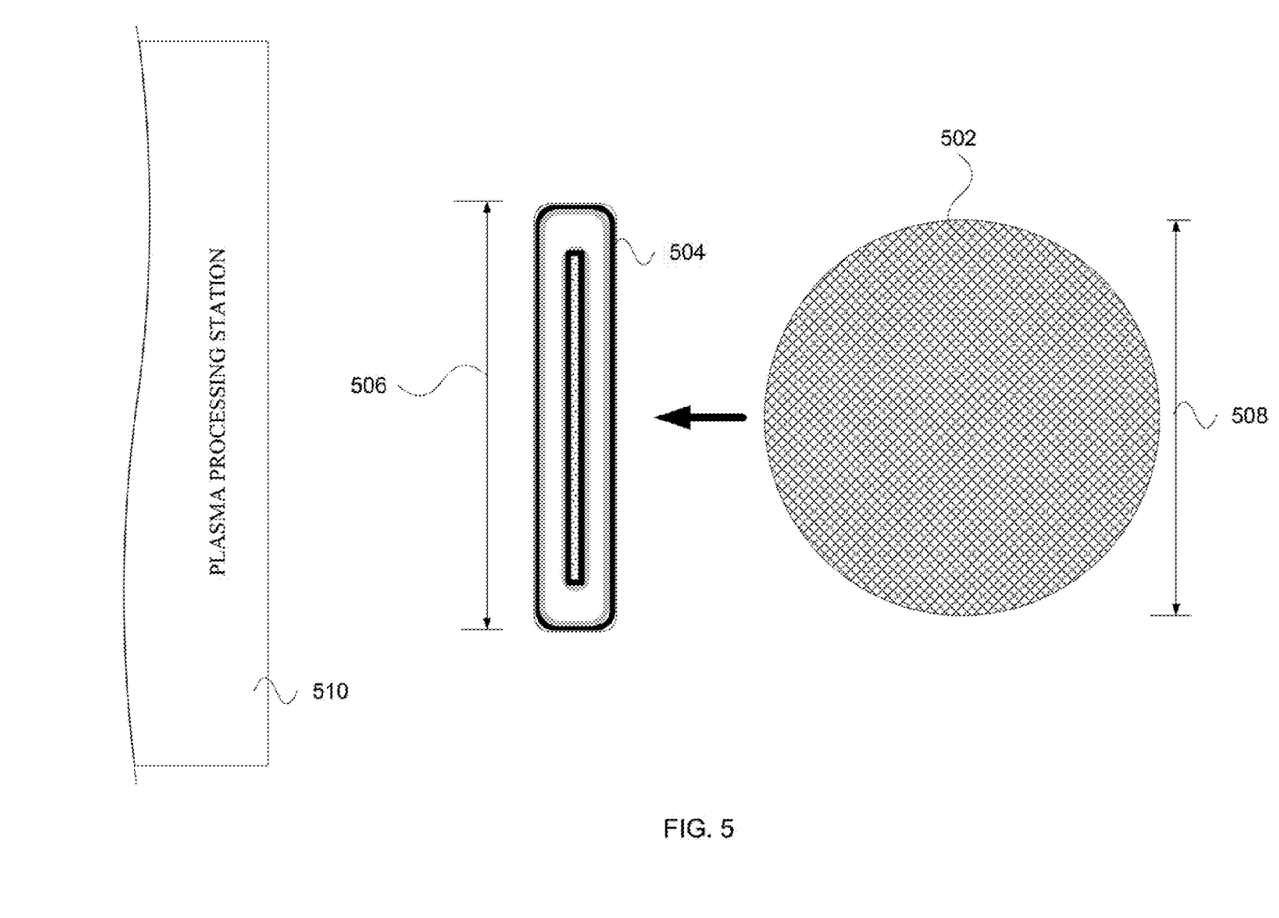
FIG. 5 shows a simplified diagram of a DWM-APPJ device configured to create an atmospheric plasma curtain, according to an embodiment of the invention.

Referring now to FIG. 5, a simplified diagram of a DWM-APPJ device configured to create an atmospheric plasma curtain is shown, according to an embodiment of the invention. In general, APPJ devices tend to have a relatively small diameter when compared to a diameter of the substrate. In order to process the entire substrate, either the APPJ device itself or the substrate must generally be rotated to insure that the plasma effluent contacts a substantial portion of the substrate surface, a potentially time consuming process. However, in an innovative fashion, DWM-APPJ 504 may be configured such that the discharge orifice width 506 is at least as wide as the diameter 508 of substrate 502. The resulting plasma effluent produces a plasma curtain that may simultaneously contract an entire slice (parallel to orifice width 506) of substrate 502, allowing a fluorinated polymer to be removed as the substrate is inserted into a plasma processing station 510 (e.g., PVD, CVD, etch, etc.), with almost no additional processing time required, substantially improving manufacturing yield.

Figure 6A:
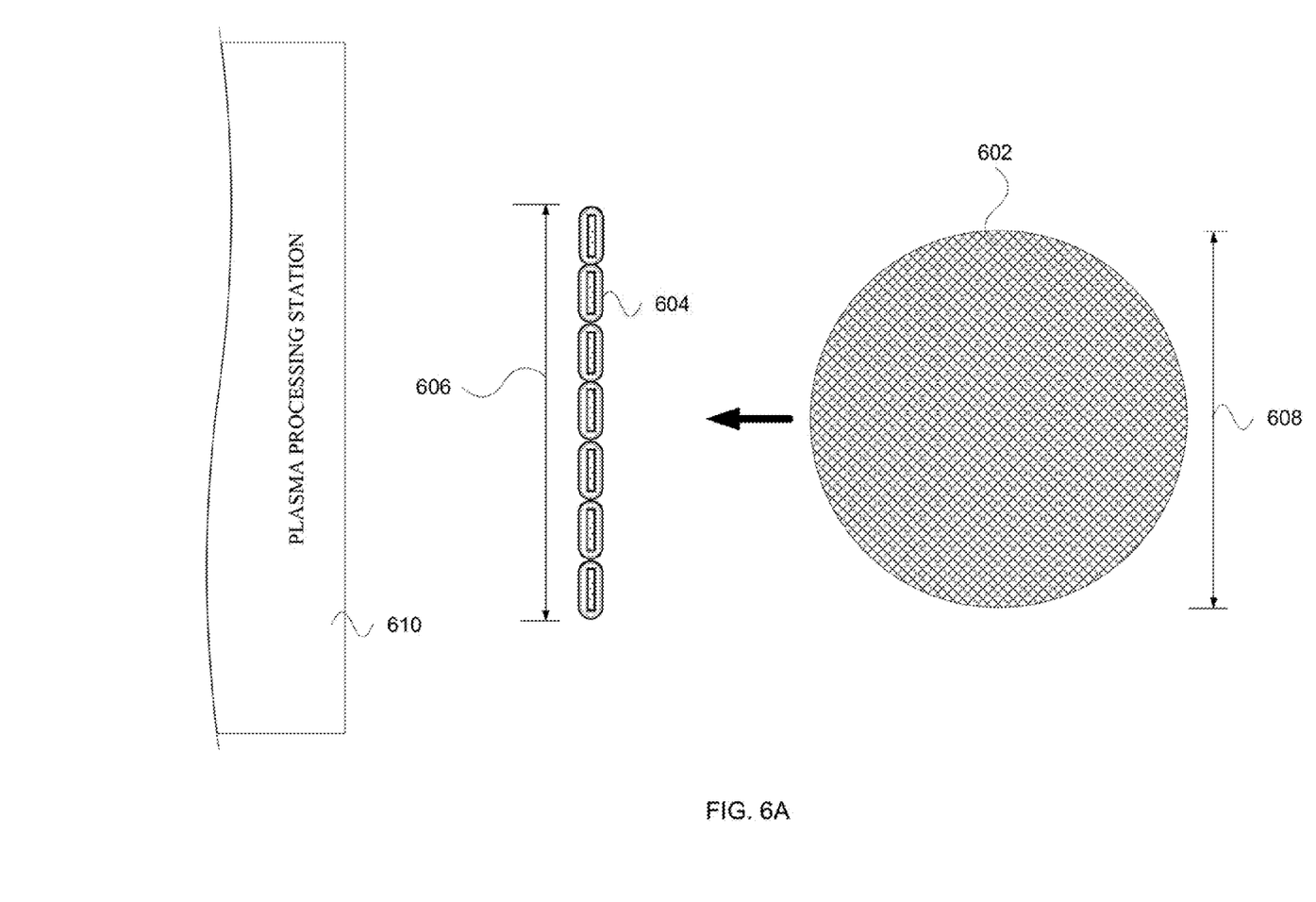
FIG. 6A shows a simplified diagram of a set of DWM-APPJ devices configured to create a plasma curtain, according to an embodiment of the invention.

Referring now to FIG. 6A, a simplified diagram of a set of DWM-APPJ devices is configured to create a plasma curtain, according to an embodiment of the invention. As previously stated, since APPJ devices tend to have a relatively small diameter when compared to the diameter of the substrate, either the APPJ device itself or the substrate is generally rotated to insure that the plasma effluent contact the entire substrate surface. However, in an innovative fashion, a set of DWM-APPJ devices 604 may configured such that the aggregate discharge orifice widths are at least as wide as the diameter of substrate 602. This may be beneficial in several respects. A set of smaller gas flow rates to correspondingly smaller DWM-APPJ devices 604 may be easier to control and tune. In addition, different DWM-APPJ devices may be configured with different flow rates and/or proportions in relationship to location (e.g., center of the substrate as opposed to edge of substrate), in relationship to time (initial atmospheric plasma contact on the substrate as opposed to the middle or end of the process), in relationship to the type of substrate, etc. As in FIG. 5, the resulting plasma effluent produces a plasma curtain that may simultaneously contract an entire slice (parallel to orifice width 606) of substrate 602, allowing fluorinated polymer to be removed as the substrate is inserted into a plasma processing station 610 (e.g., PVD, CVD, Etch, etc.), with almost no additional processing time required, substantially improving manufacturing yield.

Figure 6B:
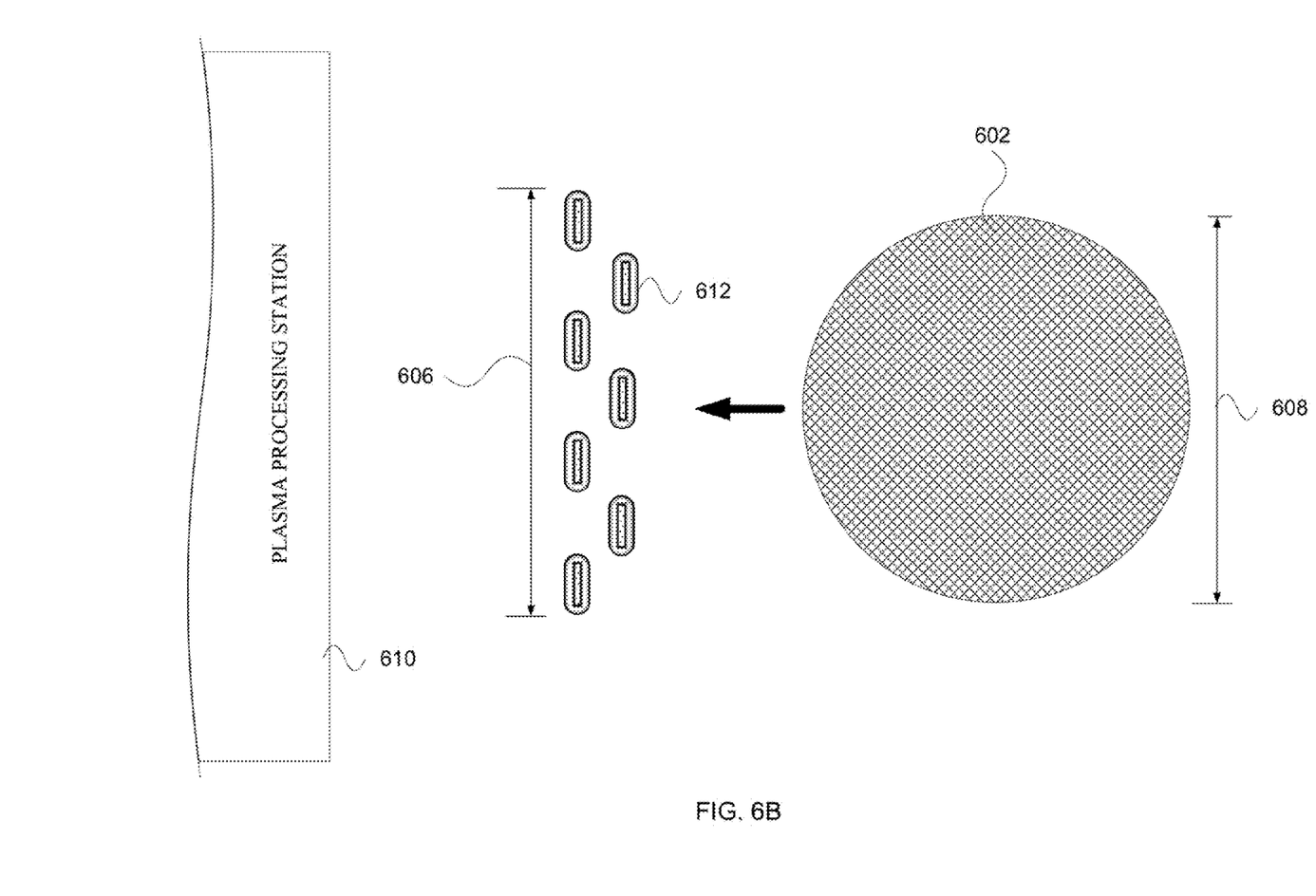
FIG. 6B shows a simplified diagram of a set of offset DWM-APPJ devices configured to create a plasma curtain, according to an embodiment of the invention.

Referring now to FIG. 6B, a simplified diagram of a set of offset DWM-APPJ devices is configured to create a plasma curtain, according to an embodiment of the invention. As previously stated, since APPJ devices tend to have a relatively small diameter when compared to the diameter of the substrate, either the APPJ device itself or the substrate is generally rotated to insure that the plasma effluent contact the entire substrate surface. However, in an innovative fashion, a set of offset DWM-APPJ devices 612 may configured such that the aggregate discharge orifice widths are at least as wide as the diameter of substrate 602. This may be beneficial in several respects. As previously state, a set of smaller gas flow rates to correspondingly smaller DWM-APPJ devices 604 may be easier to control and tune.

In addition, different DWM-APPJ devices may be configured with different flow rates and/or proportions in relationship to location (e.g., center of the substrate as opposed to edge of substrate), in relationship to time (initial atmospheric plasma contact on the substrate as opposed to the middle or end of the process), in relationship to the type of substrate, etc. Furthermore, individual plasma effluents may be isolated from each other, reducing potential cross-flow interference, and potentially improving fluorinated polymer removal efficiency. As in FIG. 5, the resulting plasma effluent produces a plasma curtain that may simultaneously contract an entire slice of substrate 602, allowing fluorinated polymer to be removed as the substrate is inserted into a plasma processing station 510 (e.g., PVD, CVD, Etch, etc.) with almost no additional processing time required, substantially improving manufacturing yield.

Figure 7:
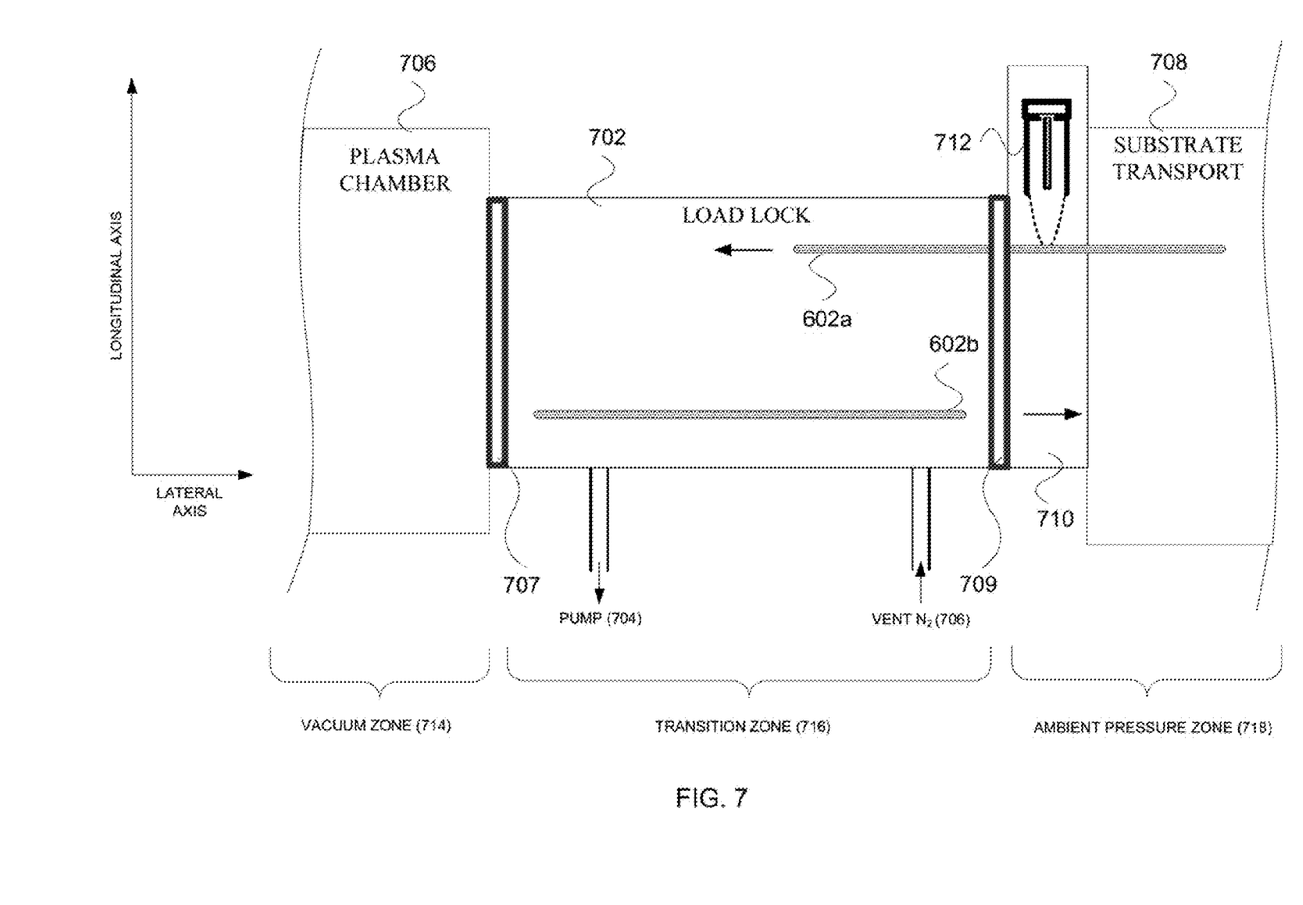
FIG. 7 shows a simplified diagram of a DWM-APPJ device coupled to a substrate load lock apparatus, according to an embodiment of the invention.

Referring now to FIG. 7, a simplified diagram of a DWM-APPJ device coupled to a substrate load lock apparatus is shown, according to an embodiment of the invention. In general, in order for a plasma processing system to operate at near vacuum conditions without having to successively pressurize and vent a plasma chamber, some type of pressure transition mechanism is needed in order to insert and remove substrates from an ambient pressure (in which substrates may be transported) to a near vacuum (in which substrates may be processed). A common pressure transition mechanism is called a load lock 702.

In general, there are three pressure zones that must be accommodated: an ambient pressure zone 718 (including substrate transport 708), a transition zone 716 (including load lock 702), and a vacuum zone 714 (including plasma chamber 706). Substrates are commonly transported to plasma chamber 706 via a substrate transport 708, which generally be maintains the substrates in an ambient pressure inert gas (e.g., $N_2$, etc.) in order to reduce contaminants. Once docked to load lock 702 via docking port 709, load lock 702 may also vented with an inert gas at ambient pressure in order to substantially match the pressure in substrate transport 708.

Once pressure is equalized between transition zone 716 and ambient zone 718, docking port 709 is opened and a to-be processed substrate 602a is inserted, while a previously processed substrate 602b is removed. Docking port 709 is then resealed, and the inert gas in load lock 702 is pumped out via pump 704, in order to substantially match the vacuum condition in plasma chamber 706. Once pressure is equalized between ambient zone 716 and vacuum zone 714, plasma chamber port 707 is opened and a to-be processed substrate 602a is inserted However, in an innovative way, a DWM-APPJ device 712 may be configured such that a fluorinated polymer is removed from a substrate as it is being inserted into load lock 702, substantially reducing the amount of additional process time that would normally be required to clean the substrate. That is, without DWM-APPJ device 712, the substrates would need to be transported to a specialized cleaning station, and then, once processed, transported to back plasma chamber 706.

In addition, since fluorinated polymers are generally volatile when exposed to the DWM-APPJ effluent, any generated byproducts may be safely pumped out of local lock 702 via pump 704 during the process pressure equalization process previously described. This embodiment is also very beneficial in that it postpones cleaning to a point just before processing, substantially reducing the window at which substrate contamination may occur to the few inches between load lock 702 and plasma chamber 706.

Figure 8:
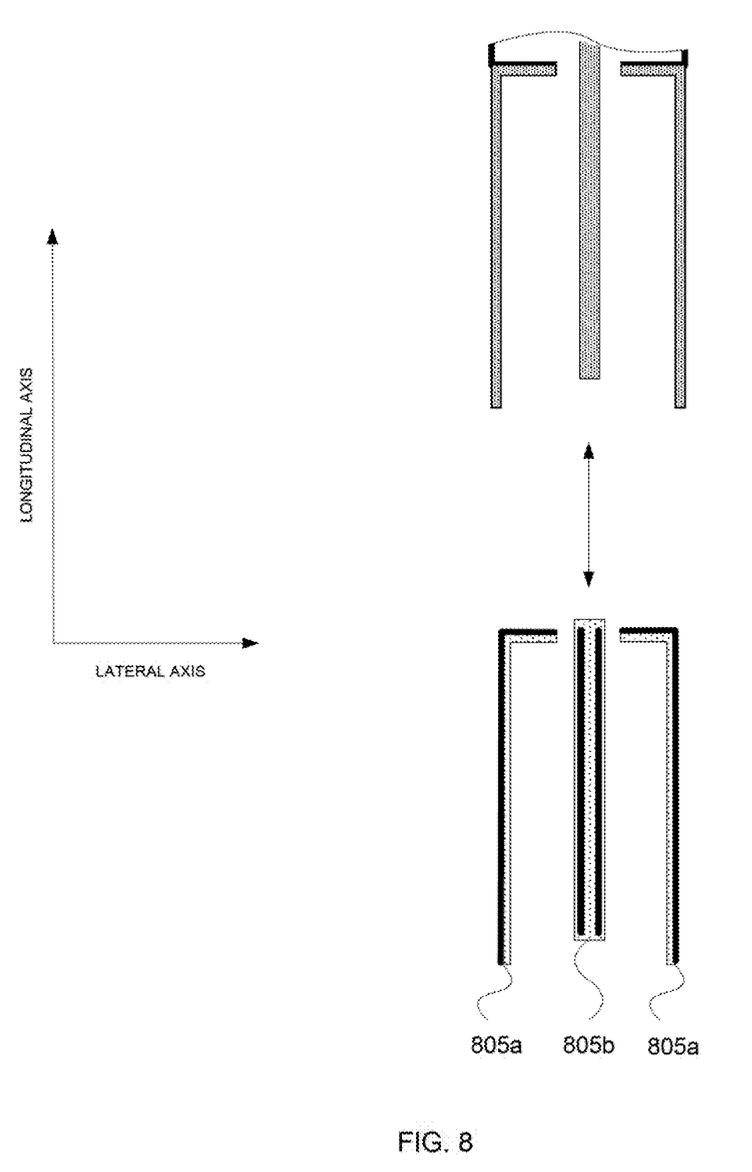
FIG. 8 shows a simplified diagram of a DWM-APPJ device, in which a set of wire mesh-dielectric sleeves is changeable, according to an embodiment of the invention.

Referring now to FIG. 8, a simplified diagram of a DWM-APPJ device, in which a set of wire mesh-dielectric sleeves is changeable is shown, according to an embodiment of the invention. As previously described, an rf field may be attenuated in different amounts and to different degrees by altering diameter of the wire mesh holes. Hence, allowing various wire mesh-dielectric sleeves 805*a* and 805*b*, each with different wire mesh hole diameter, may allow the DWM-APPJ device to be optimized for a particular configuration or recipe. That is, each wire mesh-dielectric sleeve 805*a* and 805*b* may be positioned in the DWM-APPJ between the appropriate electrode and a plasma in order to minimize arcing. In an embodiment, 805*a* and 805*b* have the same hole diameter, for any given configuration. In an embodiment, 805*a* and 805*b* have different hole diameters for any given configuration.

In an embodiment, a wire mesh layer is sandwiched between to dielectric layers. In an embodiment, a wire mesh layer is bonded to a dielectric layer with an adhesive, such as a silicon adhesive. In an embodiment, a wire mesh layer is secured to a dielectric layer using a pressure force (along a lateral axis). In an embodiment, a wire mesh layer is secured to a dielectric layer using a friction force (along a longitudinal axis). In an embodiment, a wire mesh-dielectric sleeve is secured to an electrode using a pressure force (along a lateral axis). In an embodiment, a wire mesh-dielectric sleeve is secured to a dielectric layer using a friction force (along a longitudinal axis).

For example, decreasing the flow rate of an inert gas would generally increase the likelihood of arcing for a given configuration (e.g., process gas flow rate, process gas type, rf power, etc.). However, inserting a set of wire mesh sleeves each with a smaller hole diameter may sustain the plasma at the lower inert gas flow rate without arcing. In addition, different wire mesh materials (e.g., composite metals, platinum, etc.) may also be used, without the necessity of having to redesign the DWM-APPJ device itself.

Figure 9:
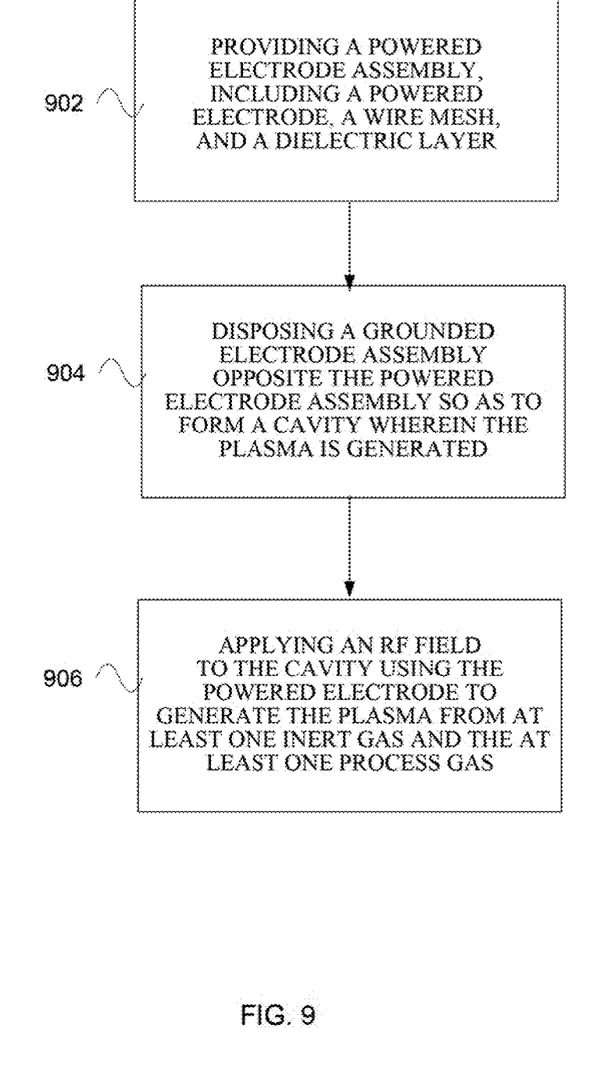
FIG. 9 shows a simplified method of optimally removing a fluorinated polymer from a substrate with a DWM-APPJ device, according to an embodiment of the invention.

Referring now to FIG. 9, a simplified method of optimally removing a fluorinated polymer from a substrate with a DWM-APPJ device is shown, according to an embodiment of the invention. Initially, at 902, a powered electrode assembly, including a powered electrode, a wire mesh, and a dielectric layer is provided. In an embodiment, the wire mesh may include one of copper, stainless steel, brass, and galvanized metal. In an embodiment, the dielectric layer may include one of silicon dioxide, silicon nitride, MYLAR®, ceramic, or TEFLON®. Next, at 904, a grounded electrode assembly is disposed opposite the powered electrode assembly so as to form a cavity wherein the plasma is generated. In an embodiment, the cavity may be an annular volume. In an embodiment, the powered electrode is a longitudinal probe configured in the cavity. Next, at 906, an rf field is applied to the cavity using the powered electrode to generate the plasma from at least one inert gas and the at least one process gas.

This invention is substantially distinguished from the prior art in several respects. For example, this combines at least one dielectric barrier and at least one wire mesh with an APPJ (DWM-APPJ) in order to generate a plasma jet that substantially removes fluorinated polymer byproducts at a particular substrate location with a relatively small inert gas flow rate (less than about 1 slm). In addition, unlike common and more complex APPJ device configurations, this invention does not reduce arcing through the use of slots, high flow velocities, and/or an alumina cap. Furthermore, this invention does not require any specialized and/or equipment to maintain a vacuum, does not physically contact to the substrate minimizing the likelihood of a damaging scratch, and is relatively easy to integrate into existing processes because of the minimal equipment requirements.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, LCD, etc.). Furthermore, the term set as used herein includes one or more of the named element of the set. For example, a set of "X" refers to one or more "X."

Advantages of the invention include the removal of a fluorinated polymer from a substrate at a relatively low (less than about 1 slm) inert gas flow rate with minimal arcing. Additional advantages include the ability to easily integrate a DWM-APPJ cleaning device into an in-situ wet cleaning process, and the optimization of a substrate manufacturing process.

Having disclosed exemplary embodiments and the best mode, modifications and variations may be made to the disclosed embodiments while remaining within the subject and spirit of the invention as defined by the following claims.

What is claimed is:

1. An apparatus for removing fluorinated polymer from a substrate, comprising:
   a plasma jet comprising:
      a powered electrode assembly comprising a powered electrode having RF power at a frequency from about 2 MHz to about 13.56 MHz, a first dielectric layer, and a first wire mesh disposed between the powered electrode and the first dielectric layer;
      a grounded electrode assembly disposed opposite the powered electrode assembly so as to form a cavity wherein the plasma is generated, wherein the first wire mesh is shielded from the plasma by the first dielectric layer when the plasma is present in the cavity, wherein the cavity has an inlet for providing an inert gas and a process gas and an outlet for providing plasma to remove fluorinated polymer from the substrate; and
      an inert gas flow rate controller configured to deliver inert gas to the cavity;
   a substrate transport device; and
   a load dock for loading the substrate into a plasma processing chamber, the plasma jet being disposed at an entry point of the load dock and above a surface of the substrate when the substrate enters or leaves the load dock via the entry point, the plasma jet being disposed between the substrate transport device and the load dock, wherein the plasma jet is operable to clean a surface of the substrate entering or leaving the load dock.

2. The apparatus of claim 1, wherein the cavity comprises an annular volume.

3. The apparatus of claim 1, wherein the cavity comprises a cavity diameter along a lateral axis, wherein the cavity diameter is at least as large as a substrate diameter.

4. The apparatus of claim 1, wherein the apparatus is configured for removing fluorinated polymer from a 300 mm substrate with a volume of inert gas comprising less than about ten standard liters.

5. The apparatus of claim 1, wherein the powered electrode is powered with 1-20 Watts RF power.

6. The apparatus of claim 1, wherein the grounded electrode assembly comprises:
   a grounded electrode,
   a second dielectric layer, and
   a second wire mesh, wherein the second wire mesh is disposed between the grounded electrode and the second dielectric layer such that the second wire mesh is shielded from plasma by the second dielectric layer when the plasma is present in the cavity.

7. The apparatus of claim 6, wherein the first and second dielectric layers comprise of at least one member selected from the group consisting of silicon dioxide, silicon nitride, polyethylene terephthalate polyester film, ceramic, and synthetic fluoropolymer of tetrafluoroethylene.

8. The apparatus of claim 6, wherein the first and second wire meshes comprise at least one member selected from the group consisting of copper, stainless steel, brass, and galvanized metal.

9. The apparatus of claim 6, wherein the first and second wire meshes comprise at least one configuration selected from the group consisting of monofilament, rectangular weave and hexagon weave.

10. An apparatus for removing fluorinated polymer from a substrate, comprising:
   a plasma processing chamber;
   a plasma jet comprising:
      a powered electrode assembly, comprising a powered electrode, a first dielectric layer, and a first wire mesh disposed between the powered electrode and the first dielectric layer; and
      a grounded electrode assembly disposed opposite the powered electrode assembly so as to form a cavity wherein the plasma is generated, wherein the first wire mesh is shielded from the plasma by the first dielectric layer when the plasma is present in the cavity, wherein the cavity has an inlet for providing an inert gas and a process gas and an outlet for providing plasma to remove fluorinated polymer from the substrate;
   a substrate transport device; and
   a load dock disposed between the plasma processing chamber and the substrate transport device, the load dock for loading the substrate into the plasma processing chamber, the plasma jet being disposed at an entry point of the load dock and above a surface of the substrate when the substrate enters or leaves the load dock via the entry point, the plasma jet being disposed between the substrate transport device and the load dock, wherein the plasma jet is operable to clean a surface of the substrate entering or leaving the load dock.

11. The apparatus of claim 10, wherein the cavity comprises an annular volume.

12. The apparatus of claim 10, wherein the cavity comprises a cavity diameter along a lateral axis, wherein the cavity diameter is at least as large as a substrate diameter.

13. The apparatus of claim 10, wherein the powered electrode is powered with 1-20 Watts RF power at a frequency from about 2 MHz to about 13.56 MHz.

14. The apparatus of claim 10, wherein the grounded electrode assembly comprises:
   a grounded electrode,
   a second dielectric layer, and
   a second wire mesh, wherein the second wire mesh is disposed between the grounded electrode and the second dielectric layer such that the second wire mesh is shielded from plasma by the second dielectric layer when the plasma is present in the cavity.

15. The apparatus of claim 14, wherein the first and second dielectric layers comprise of at least one member selected from the group consisting of silicon dioxide, silicon nitride, polyethylene terephthalate polyester film, ceramic, and synthetic fluoropolymer of tetrafluoroethylene.

16. The apparatus of claim 14, wherein the first and second wire meshes comprise at least one member selected from the group consisting of copper, stainless steel, brass, and galvanized metal.

17. The apparatus of claim 14, wherein the first and second wire meshes comprise at least one configuration selected from the group consisting of monofilament, rectangular weave and hexagon weave.

18. The apparatus of claim 10, further comprising:
   an inert gas flow rate controller configured to deliver inert gas to the said cavity at less than about 1 standard liter per minute.

19. The apparatus of claim 18, wherein the apparatus is configured for removing fluorinated polymer from a 300 mm substrate with a volume of inert gas comprising less than about ten standard liters.

* * * * *